(12) United States Patent
Wi et al.

(10) Patent No.: US 12,183,545 B2
(45) Date of Patent: Dec. 31, 2024

(54) PLASMA REACTOR

(71) Applicant: NEW POWER PLASMA CO., LTD., Suwon-si (KR)

(72) Inventors: Soon Im Wi, Seoul (KR); Sung Joong Kim, Gwangju-si (KR); Yoon Jae Kim, Suwon-si (KR); Je Hyeong Yoo, Suwon-si (KR)

(73) Assignee: NEW POWER PLASMA CO., LTD., Suwon-si (KR)

( * ) Notice: Subject to any disclaimer, the term of this patent is extended or adjusted under 35 U.S.C. 154(b) by 125 days.

(21) Appl. No.: 17/951,529

(22) Filed: Sep. 23, 2022

(65) Prior Publication Data

US 2023/0087537 A1 Mar. 23, 2023

(30) Foreign Application Priority Data

Sep. 23, 2021 (KR) .......................... 10-2021-0125988

(51) Int. Cl.
*H01J 37/32* (2006.01)
(52) U.S. Cl.
CPC ........ *H01J 37/321* (2013.01); *H01J 37/3244* (2013.01); *H01J 2237/327* (2013.01)
(58) Field of Classification Search
CPC . H01J 37/321; H01J 37/3244; H01J 2237/327
See application file for complete search history.

(56) References Cited

U.S. PATENT DOCUMENTS

| | | | | |
|---|---|---|---|---|
| 11,019,714 | B1 * | 5/2021 | Rogers | ................ H01F 27/385 |
| 2013/0307414 | A1 * | 11/2013 | Choi | ................ H01J 37/32816 |
| | | | | 315/111.51 |
| 2014/0346952 | A1 * | 11/2014 | Choi | ........................ H05H 1/46 |
| | | | | 315/111.21 |
| 2019/0089135 | A1 * | 3/2019 | Gupta | ................ H01J 37/3299 |
| 2019/0288737 | A1 * | 9/2019 | Hanks | .................... H03F 3/211 |

FOREIGN PATENT DOCUMENTS

| | | | |
|---|---|---|---|
| JP | S59173771 | A | 10/1984 |
| JP | H02195698 | A | 8/1990 |
| JP | H021955698 | * | 8/1990 |
| KR | 20120019927 | A | 3/2012 |
| KR | 20140137172 | A | 12/2014 |

OTHER PUBLICATIONS

Office Action of KIPO for Korean application No. 1020210125988, issued on Jul. 15, 2023.

* cited by examiner

*Primary Examiner* — Minh D A
(74) *Attorney, Agent, or Firm* — Steve Jae Youn Kim; NKL Law

(57) ABSTRACT

Provided is a plasma reactor including a reactor body having a gas inlet at a side thereof, a gas outlet at another side thereof, and an annular loop space therein, a magnetic core provided in a shape surrounding a portion of the reactor body, and wound with a primary coil for receiving power from a power unit, so as to generate plasma by exciting a gas in the annular loop space, and a control unit for determining whether the plasma is in an off state, by comparing, to a reference value, an electrical parameter related to an output of the primary coil.

9 Claims, 3 Drawing Sheets

PLASMA REACTOR

CROSS-REFERENCE TO RELATED PATENT APPLICATION

This application claims the benefit of Korean Patent Application No. 10-2021-0125988, filed on Sep. 23, 2021, in the Korean Intellectual Property Office, the disclosure of which is incorporated herein in its entirety by reference.

BACKGROUND

1. Field

The present invention relates to a plasma apparatus and, more particularly, to a plasma reactor.

2. Description of the Related Art

In general, plasma discharge is used for gas excitation to generate an active gas. The active gas is widely used in various fields and typically in various semiconductor or display manufacturing processes such as deposition, etching, and ashing.

Currently, wafers or liquid crystal display (LCD) glass substrates for manufacturing semiconductor devices are increasing in size. As such, a scalable plasma reactor having a high plasma generation controllability and a large-area processability is demanded. Furthermore, because a process chamber volume is increasing due to the increase in substrate size, a plasma reactor capable of remotely and sufficiently supplying a high-density active gas is also demanded.

Meanwhile, plasma reactors include those using transformer coupled plasma (TCP) and those using inductively coupled plasma (ICP). The plasma reactor using TCP has a structure in which a magnetic core with a primary coil is mounted on a toroidal reactor body. The plasma reactor using ICP has a structure in which an inductively coupled antenna is mounted on a hollow tubular reactor body.

In the plasma reactor using TCP, monitoring of a plasma environment and feedback control using the same are getting critical. Regarding TCP, when the plasma is in an off state, although power is continuously supplied to a primary side of the transformer, the power is not consumed but returns to a power unit to damage the power unit. Therefore, the off state of the plasma needs to be monitored to prevent the damage of the power unit.

SUMMARY

The present invention provides a plasma reactor capable of preventing damage of a power unit by monitoring an off state of plasma. However, the scope of the present invention is not limited thereto.

According to an aspect of the present invention, there is provided a plasma reactor including a reactor body having a gas inlet at a side thereof, a gas outlet at another side thereof, and an annular loop space therein, a magnetic core provided in a shape surrounding a portion of the reactor body, and wound with a primary coil for receiving power from a power unit, so as to generate plasma by exciting a gas in the annular loop space, and a control unit for determining whether the plasma is in an off state, by comparing, to a reference value, an electrical parameter related to an output of the primary coil.

The control unit may control the power unit to cut off or reduce supply of the power from the power unit to the primary coil when it is determined that the plasma in the reactor body is in an off state.

The power unit may include an inverter for switching the power, and the control unit may turn off the inverter when it is determined that the plasma in the reactor body is in an off state.

The electrical parameter may include a phase difference between a current and a voltage through the primary coil.

The plasma reactor may further include a sensor unit for measuring an electrical signal for obtaining the electrical parameter, and the control unit may obtain the electrical parameter based on the electrical signal.

The sensor unit may include a first sensor mounted on the primary coil to measure a current, and a second sensor for measuring a voltage through a secondary coil wound around the magnetic core, the electrical signal may include the current and the voltage, and the electrical parameter may include a phase difference between the current and the voltage.

The sensor unit may further include a third sensor for measuring active power transferred through the primary coil, the electrical signal may include the current, the voltage, and the active power, and the control unit may obtain apparent power based on a root mean square (RMS) value of the voltage and an RMS value of the current, and obtain the phase difference based on the active power and the apparent power.

The reference value may be set as a certain range including the electrical parameter of a case when the plasma is in an on state, and the control unit may determine that the plasma in the reactor body is in an off state, when the phase difference is greater than the reference value.

The control unit may preset a reference voltage for arc detection, and detect whether an arc is generated in the reactor body, by comparing, to the reference voltage, the voltage measured by the second sensor.

The control unit may detect that an arc is generated in the reactor body, when the voltage is less than or equal to the reference voltage.

The control unit may preset a reference current for arc detection, and detect whether an arc is generated in the reactor body, by comparing, to the reference current, the current measured by the first sensor.

The control unit may detect that an arc is generated in the reactor body, when the current is greater than or equal to the reference current.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
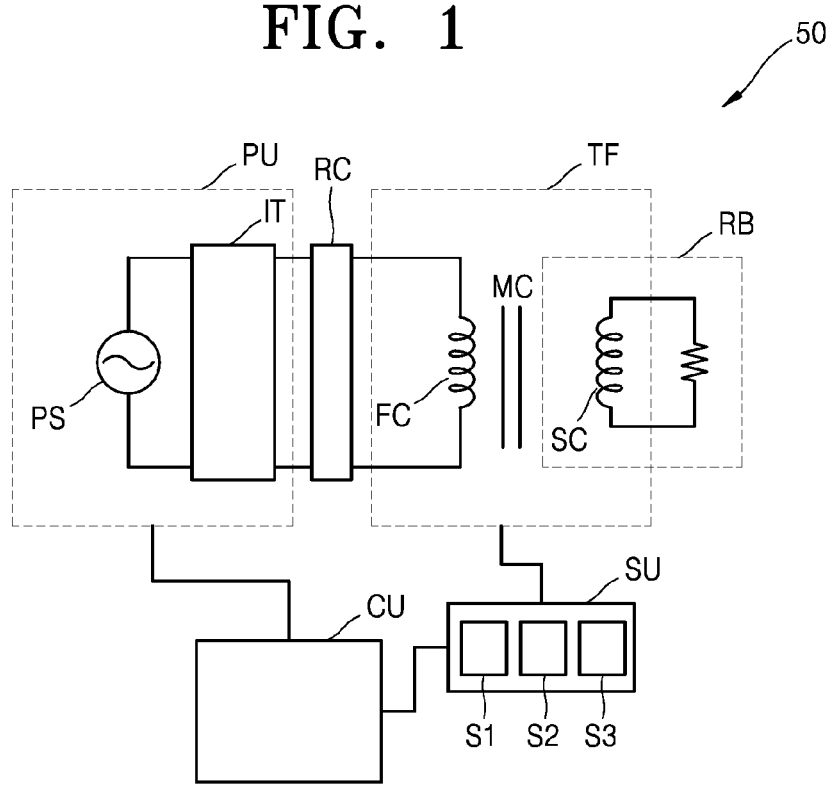
FIG. 1 is a circuit diagram of a plasma reactor according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. For convenience of explanation, the sizes of at least some elements may be exaggerated or reduced in the drawings. Like reference numerals denote like elements throughout.

Unless defined differently, all terms used herein have the same meaning as generally understood by one of ordinary skill in the art. In the drawings, layers and regions are exaggerated in size for explanation, and thus are provided to describe general structures of the present invention.

Like reference numerals denote like elements. It will be understood that when an element, such as a layer, a region, or a substrate, is referred to as being "on" another element, it may be directly on the other element or intervening elements may be present. In contrast, when an element is referred to as being "directly on" another element, there are no intervening elements present.

FIG. 1 is a circuit diagram of a plasma reactor 50 according to an embodiment of the present invention.

Referring to FIG. 1, the plasma reactor 50 may include a power unit PU, a transformer TF, a reactor body RB, a sensor unit SU, and a control unit CU.

The reactor body RB may define a reaction space where plasma is generated. The reactor body RB may have a gas inlet at a side thereof and a gas outlet at another side thereof. A gas injected into the reactor body RB may be activated by the plasma and discharged as an active gas. For example, the reactor body RB may have a toroidal structure and be represented by an equivalent circuit having inductance and reactance.

The transformer TF may have a primary side connected to the power unit PU, and a secondary side coupled to the reactor body RB to generate plasma of the gas in the reactor body RB. For example, the transformer TF may include a primary coil FC, a magnetic core MC, and a secondary coil SC. Specifically, the magnetic core MC may be provided to surround a portion of the reactor body RB, and the primary coil FC may be coupled to the magnetic core MC and connected to the power unit PU to generate the plasma of the gas in the reactor body RB. As such, the reactor body RB may serve as the secondary coil SC, and the plasma generated in the reactor body RB may serve as the secondary side of the transformer TF.

The power unit PU may supply power to the transformer TF. For example, the power unit PU may include a power source PS and an inverter IT. The inverter IT may switch power supplied from the power source PS by using one or more switching semiconductor devices and supply the switched power to the primary coil FC of the transformer TF. For example, the inverter IT may include one or more semiconductor transistors as the switching semiconductor devices. The power unit PU may supply the power in a frequency modification (FM) or pulse width modification (PWM) manner.

In some embodiments, optionally, a resonant circuit RC may be added between the power unit PU and the primary coil FC of the transformer TF. For example, the resonant circuit RC may include at least one resonant inductor connected to the primary coil FC in series, and at least one resonant capacitor connected to the primary coil FC in parallel. The resonant circuit RC may constitute an LC circuit or an LCL circuit.

The resonant circuit RC may be designed considering the frequency of the power source PS, the impedance of the reactor body RB, etc. to increase power transfer efficiency between the power unit PU and the reactor body RB. The resonant circuit RC may function to increase power transfer efficiency to the reactor body RB until plasma ignition and limit a current flowing to the power unit PU after plasma ignition.

The control unit CU may be connected to at least some of the power unit PU, the transformer TF, the sensor unit SU, and the reactor body RB to monitor and control the plasma reactor 50. For example, the control unit CU may determine a state of the plasma based on an electrical parameter related to an output of the transformer TF or the plasma. Specifically, the control unit CU may determine an off state of the plasma by comparing, to a reference value, the electrical parameter related to an output of the primary coil FC.

Furthermore, when it is determined that the plasma in the reactor body RB is in an off state, the control unit CU may control the power unit PU to cut off or reduce the supply of the power from the power unit PU to the primary coil FC. For example, when it is determined that the plasma in the reactor body RB is in an off state, the control unit CU may cut off the supply of the power to the primary coil FC by turning off the inverter IT in the power unit PU.

The sensor unit SU may be provided on the plasma reactor 50 to measure an electrical signal for obtaining the electrical parameter. For example, the sensor unit SU may be connected to the transformer TF and the control unit CU, and optionally to the power unit PU.

The sensor unit SU may include a first sensor S1 mounted on the primary coil FC to measure a current, and a second sensor S2 for measuring a voltage. Furthermore, the sensor unit SU may further include a third sensor S3 for measuring active power transferred through the primary coil FC.

The sensor unit SU may measure the electrical signal and provide the same to the control unit CU, and the control unit CU may obtain the electrical parameter based on the electrical signal received from the sensor unit SU. In a modified example of the current embodiment, the sensor unit SU may directly measure the electrical parameter.

The control unit CU may obtain the electrical parameter by using the sensor unit SU, and monitor the state of the plasma in the reactor body RB based on the electrical parameter. For example, the control unit CU may monitor whether the plasma in the reactor body RB is in an on state or an off state.

As a result of monitoring the plasma in the reactor body RB, when it is determined that the plasma is in an off state, the control unit CU may cut off the power supply of the power unit PU. As such, providing of the power to the primary coil FC due to accidents, mistakes, malfunctions, etc. may be reduced and the power unit PU may be prevented from being damaged due to the power returning to the power unit PU when the plasma in the reactor body RB is in an off state.

Figure 2:
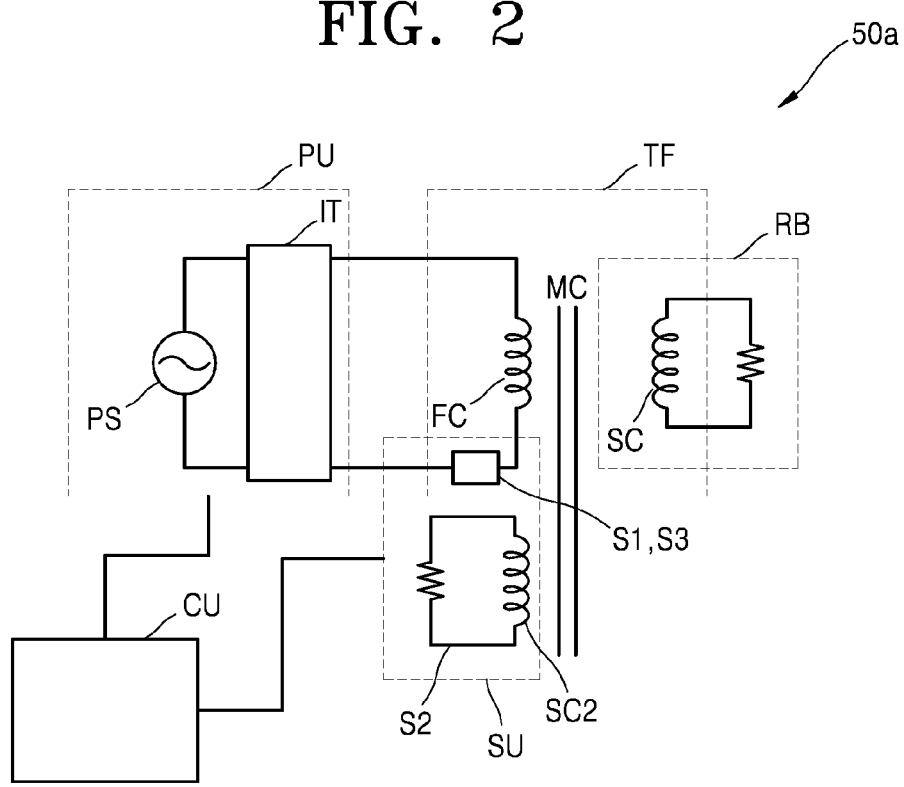
FIG. 2 is a circuit diagram of a plasma reactor according to another embodiment of the present invention.

FIG. 2 is a circuit diagram of a plasma reactor 50a according to another embodiment of the present invention. The plasma reactor 50a is obtained by adding or modifying some elements to or of the plasma reactor 50 of FIG. 1, and thus a repeated description therebetween is not provided herein.

Referring to FIG. 2, the plasma reactor 50a may include the power unit PU, the transformer TF, the sensor unit SU, and the control unit CU.

In the sensor unit SU, the first sensor S1 and/or the third sensor S3 may be coupled to the transformer TF or the power unit PU. For example, the first sensor S1 may be provided in the form of a current transformer. The second sensor S2 may measure a voltage through a secondary coil SC2 wound around the magnetic core MC. For example, a voltage applied to the primary coil FC may be indirectly measured by measuring a voltage applied to a resistor connected to the secondary coil SC2.

The sensor unit SU may measure a current, a voltage, and active power by using the first to third sensors S1, S2, and S3. Therefore, electrical signals measured using the sensor unit SU may include the current, the voltage, and the active power.

Optionally, in the plasma reactor 50a, the resonant circuit RC of FIG. 1 may be further added between the power unit PU and the transformer TF.

The control unit CU may obtain a phase difference between the current and the voltage and use the same as an electrical parameter. For example, the electrical parameter may include the phase difference between the current and the voltage through the primary coil FC. The control unit CU may compare the phase difference to a reference value to determine whether plasma is in an on state or an off state.

In a plasma ignition operation, although the plasma is in an off state, the control unit CU may misrecognize that the plasma is in an on state, and continue to apply power to the primary coil FC. In this case, because the plasma is actually in an off state, the power applied to the primary coil FC may return to the power unit PU to damage the power unit PU.

Therefore, the control unit CU needs to operate by recognizing an on/off state of the plasma by checking the phase difference between the current and the voltage as the electrical parameter related to an output of the primary coil FC.

The control unit CU may obtain the phase difference between the current and the voltage as described below.

In plasma power transfer, the active power may be expressed as a product of apparent power and a power factor. When the phase difference between the current and the voltage is denoted by θ, the power factor may be expressed as cos θ. Herein, the phase difference between the current and the voltage is not easily directly measured and thus may be obtained by initially measuring the active power and the apparent power and then calculating the power factor.

The apparent power may be expressed as a product of a root mean square (RMS) value of the voltage and an RMS value of the current. Therefore, the apparent power may be obtained by measuring the current and the voltage and obtaining the RMS values thereof and, when the active power is additionally measured, the power factor may be calculated based on the active power and the apparent power. The phase difference between the current and the voltage may be obtained based on the power factor. Thus, the control unit CU may measure the current, the voltage, and the active power as the electrical signals by using the sensor unit SU, and thus obtain the phase difference between the current and the voltage.

In a modified example of the current embodiment, the sensor unit SU may directly measure the phase difference.

A method of monitoring a state of plasma by using a phase difference between a current and a voltage will now be described.

Figure 4:
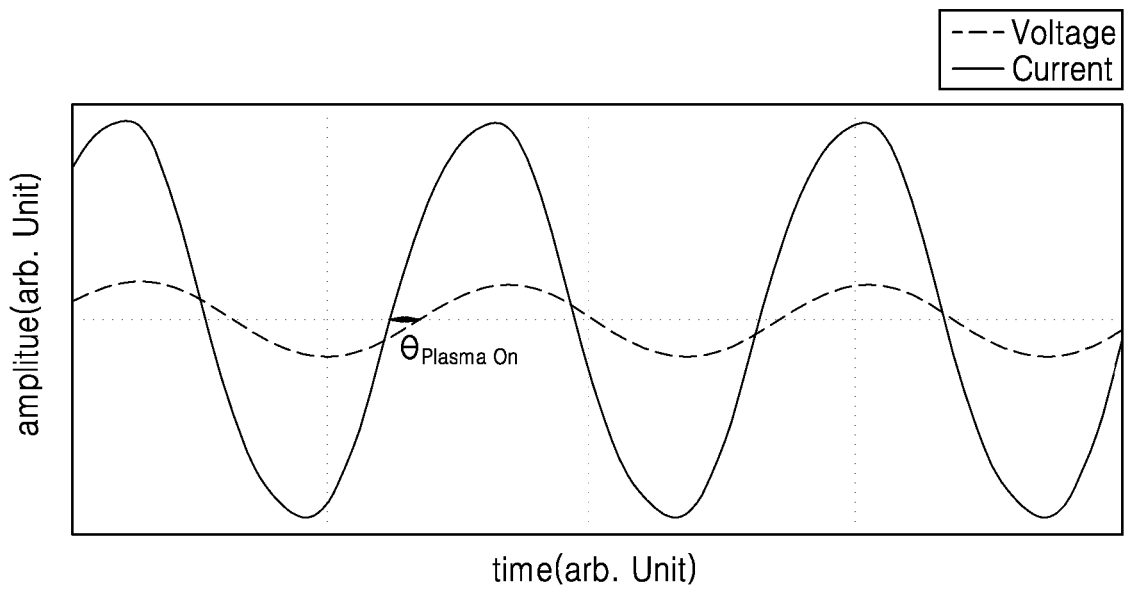
FIG. 4 is a graph showing waveforms of a voltage and a current when plasma in a plasma reactor is in an on state, according to embodiments of the present invention.
Figure 5:
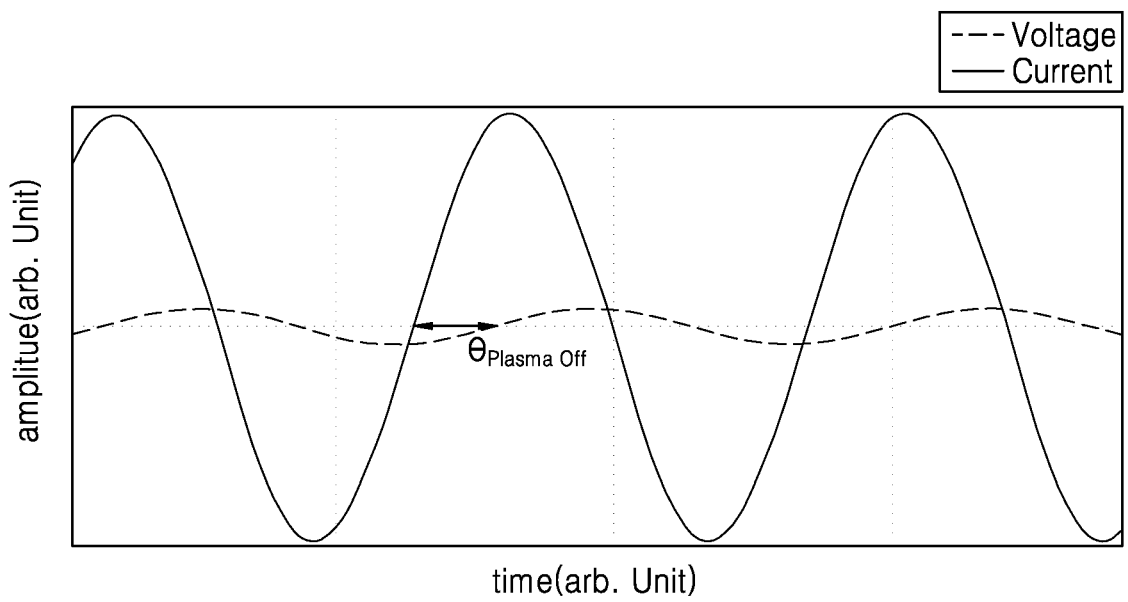
FIG. 5 is a graph showing waveforms of a voltage and a current when plasma in a plasma reactor is in an off state, according to embodiments of the present invention.

FIG. 4 is a graph showing waveforms of a voltage and a current when plasma in a plasma reactor is in an on state, according to embodiments of the present invention, and FIG. 5 is a graph showing waveforms of a voltage and a current when plasma in a plasma reactor is in an off state, according to embodiments of the present invention.

Referring to FIGS. 4 and 5, it is shown that a phase difference between the current and the voltage when the plasma is in an off state (see FIG. 5) is greater than the phase difference between the current and the voltage when the plasma is in an on state (see FIG. 4).

According to the plasma reactors 50 and 50a of the present invention, the phase difference between the current and the voltage may normally range from about 10° to about 30° when the plasma is in an on state, or range from about 70° to about 90° when the plasma is in an off state.

Therefore, an on/off state of the plasma may be determined by obtaining an electrical parameter of the plasma reactors 50 and 50a, e.g., a phase difference, and comparing the same to a reference value. For example, the reference value may be set as a certain range including the electrical parameter, e.g., the phase difference, of a case when the plasma is in an on state, and the control unit CU may determine that the plasma in the reactor body RB is in an off state, when the electrical parameter, e.g., the phase difference, of the plasma reactors 50 and 50a is greater than the reference value.

As another example, the reference value may be set as a certain range including the electrical parameter, e.g., the phase difference, of a case when the plasma is in an off state, and the control unit CU may determine that the plasma in the reactor body RB is in an off state, when the electrical parameter, e.g., the phase difference, of the plasma reactors 50 and 50a is in the range of the reference value.

Therefore, the control unit CU may determine an on/off state of the plasma based on the electrical parameter of the plasma reactors 50 and 50a.

Meanwhile, the control unit CU may measure a current or/and a voltage as electrical signals by using the sensor unit SU, and detect whether an arc is generated in the reactor body RB, based on the same.

The arc may relate to damage of a coating layer on an inner wall of the reactor body RB, and the damage of the coating layer may gradually increase due to the plasma. The inner wall of the reactor body RB is coated with an insulating thin film such as an iridium oxide ($Y_2O_3$) layer or an aluminum oxide ($Al_2O_3$) layer.

The arc may include a soft arc and a hard arc, and the soft arc may hardly damage the insulating thin film coated on the reactor body RB whereas the hard arc may seriously damage the insulating thin film. In general, the hard arc tends to occur after a bundle of soft arcs. Therefore, by detecting an arc generated in the reactor body RB, generation of the soft arc may be previously checked and generation of the hard arc may be prevented.

The arc forms a discharge state and thus exhibits an increase in current and a decrease in voltage. Therefore, generation of the arc may be detected by monitoring the current or the voltage.

First, the arc may be detected using an output voltage. The control unit CU presets a reference voltage for arc detection. The control unit CU may measure a voltage as an electrical signal by using the sensor unit SU, and detect whether an arc is generated, by comparing the voltage to the reference voltage. For example, when the voltage is less than or equal to the reference voltage, the control unit CU may detect that an arc is generated in the reactor body RB. The control unit CU may detect generation of an arc more rapidly by checking a decrease rate per unit time ($\Delta V/\Delta t$) of the voltage measured using the sensor unit SU.

Second, the arc may be detected using an output current. The control unit CU presets a reference current for arc detection. The control unit CU may measure a current as an electrical signal by using the sensor unit SU, and detect whether an arc is generated, by comparing the current to the reference current. For example, when the current is greater than or equal to the reference current, the control unit CU may detect that an arc is generated in the reactor body RB. The control unit CU may detect generation of an arc more rapidly by checking an increase rate per unit time ($\Delta I/\Delta t$) of the current measured using the sensor unit SU.

Figure 3:
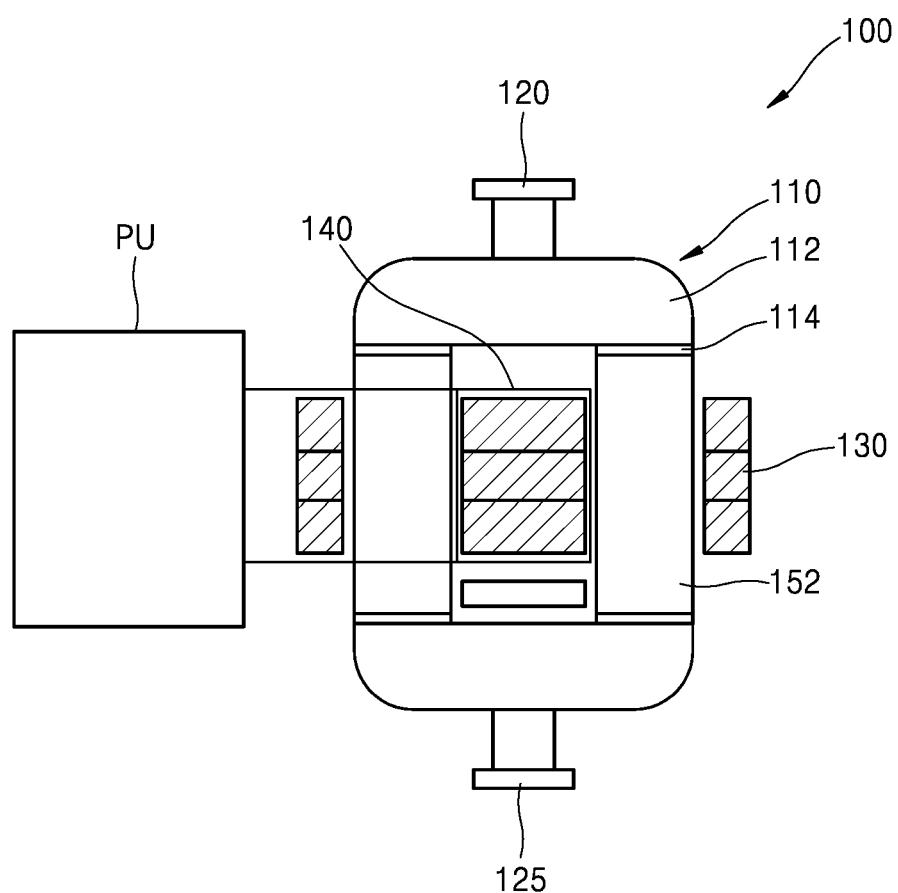
FIG. 3 is a cross-sectional view of a plasma reactor according to embodiments of the present invention.

FIG. 3 is a cross-sectional view of a plasma reactor 100 according to embodiments of the present invention. The plasma reactor 100 may be an example in which some elements of the plasma reactors 50 and 50a of FIGS. 1 and 2 are specifically implemented.

Referring to FIG. 3, the plasma reactor 100 may include the power unit PU, a reactor body 110, a magnetic core 130, and a primary coil 140.

The reactor body 110 may be provided as a specific example of the reactor body RB of FIGS. 1 and 2, and define a reaction space where plasma is generated. For example, the reactor body 110 may have a gas inlet 120 at a side thereof, a gas outlet 125 at another side thereof, and an annular loop space 112 therein. It may be understood that the annular loop space 112 of the reactor body 110 constitutes the secondary coil SC.

According to the above-described structure, a gas injected through the gas inlet 120 may be activated in the annular loop space 112, and an active gas may be discharged through the gas outlet 125. The annular loop space 112 may also be called a toroidal reaction space.

The reactor body 110 may be provided as one structure or include a plurality of blocks. The reactor body 110 may be made of a conductive metal coated with an insulating material, or an insulator such as quartz. The reactor body 110 may be provided in a tube shape to have the annular loop space 112, or provided as a block structure having the annular loop space 112 therein.

In some embodiments, the reactor body 110 may include a plurality of blocks assembled with respect to a plurality of insulation parts 114 and be divided into, for example, an upper block, a middle block, and a lower block. Specifically, the upper block may split the gas injected through the gas inlet 120 to two channels, the middle block may be provided as a pair of blocks respectively coupled to the two split channels, and the lower block may combine the two channels to discharge the gas through the gas outlet 125.

Furthermore, each of the upper block, the middle block, and the lower block may be provided as a single block, or some of them may include an assembly of a plurality of blocks.

The magnetic core 130 may be provided as an example of the magnetic core MC of FIGS. 1 and 2, and function as a core of the transformer TF. The magnetic core 130 may be provided in a shape surrounding a portion of the reactor body 110. The magnetic core 130 may be wound with the primary coil 140 for receiving power from the power unit PU so as to generate plasma by exciting the gas in the annular loop space 112.

For example, the magnetic core 130 may include one or more magnetic cores. The magnetic cores may be spaced apart from each other along an extension direction of the reactor body 110 and disposed to substantially surround the reactor body 110 once. For example, the magnetic cores may be disposed to surround the middle block of the reactor body 110 in a horizontal direction. The magnetic cores may be made of a magnetic material, e.g., ferrite.

Furthermore, when the middle block is divided into two portions, the magnetic cores may be disposed to surround both of the two portions. In this case, the magnetic cores may be disposed to be vertically stacked along the middle block of the vertical structure. Meanwhile, when the reactor body 110 is provided in the form of an annular tube overall, the magnetic cores may be disposed along the annular tube.

In some embodiments, each magnetic core in the magnetic core 130 may be provided in a single annular structure or a structure of a combination of a plurality of pieces. For example, each magnetic core may be provided as two pieces facing each other, and the two pieces may be in contact with each other or be slightly spaced apart from each other as long as magnetic lines of force form a closed loop.

In some embodiments, the magnetic core 130 may be divided and coupled to both sides of the annular loop space 112. For example, the magnetic core 130 may be divided into a first portion surrounding a left portion of the annular loop space 112, and a second portion surrounding a right portion of the annular loop space 112.

The primary coil 140 may be provided as an example of the primary coil FC of FIGS. 1 and 2. The primary coil 140 may be connected to the power unit PU, and disposed to surround a portion of the magnetic core 130. For example, the primary coil 140 is wound one or more turns around a portion of the magnetic core 130. A loop of the magnetic core 130 may be disposed substantially perpendicularly to loops of the primary coil 140.

Overall, the above-described structure may constitute the transformer TF of FIGS. 1 and 2. The magnetic core 130 may be wound with the primary coil 140, and the annular loop space 112 of the reactor body 110 may be disposed to surround the magnetic core 130. That is, the annular loop space 112 may serve as a secondary side of the transformer TF. As such, when a primary current flows through the primary coil 140, magnetic force may be induced in the magnetic core 130, and a secondary current may be induced in the annular loop space 112 by the induced magnetic force to generate plasma. In this sense, such plasma may also be called transformer coupled plasma (TCP).

By this plasma, gases in the annular loop space 112 may be activated. Such an active gas may include radicals, ions, etc. The active gas may be supplied through the gas outlet 125 to where it is needed. In this sense, the plasma reactor 100 may also be called a remote plasma generator (RPG), a remote plasma source (RPS), or a remote plasma system (RPS). However, the present invention is not limited by the above names.

Although the control unit CU and the sensor unit SU of FIGS. 1 and 2 are not shown in FIG. 3 for brevity of illustration, the control unit CU and the sensor unit SU may be connected to the reactor body 110 and the magnetic core 130 with reference to FIGS. 1 and 2.

The active gas generated in the above-described plasma reactor 100 may be used as a cleaning gas for cleaning a chamber or a process gas for processing a substrate in an apparatus for manufacturing semiconductors, displays, solar cells, or the like.

The plasma reactor 100 may be coupled to a process chamber (not shown) for processing a substrate, to constitute a substrate processing system.

The process chamber may include a process space for processing the substrate, and connected to the gas outlet 125 of the plasma reactor 100 to receive the process gas. For example, the process chamber may include a substrate holder for seating the substrate thereon. The process chamber may be used to deposit a thin film on the substrate, etch a thin film on the substrate, ash an organic material on the substrate, or clean the substrate.

The plasma reactor 100 may generate an active gas for cleaning and send the same through the gas outlet 125 to the process chamber to clean the process chamber, or provide an active process gas through the gas outlet 125 to the process chamber to process the substrate in the process chamber.

For example, when the active process gas is provided to process the substrate in the process chamber, the reactor body 110 may be made of a dielectric material such as quartz, an insulated aluminum block, or glass, and formed by fusing or welding at least two pieces together. Herein, the primary coil 140 may be a conductor plate provided on a surface of the reactor body 110.

In some embodiments, the reactor body 110 may have a first cooling jacket (not shown) mounted at the front to cool a surface thereof, and a second cooling jacket (not shown) mounted at the rear to cool another surface thereof. In this case, the first and second cooling jackets may be optionally connected to the primary coil 140 and used as an additional coil. The first and second cooling jackets may be provided between the reactor body 110 and the primary coil 140.

The magnetic core 130 may include four unit cores disposed in four directions to form an X shape overall, and fore-ends of the unit cores may be inclined in such a manner that central interfaces thereof are in contact with each other in an X shape. In this case, each of the unit cores may be provided to surround a portion of the reactor body 110, a portion of the primary coil 140, and portions of the first and second cooling jackets.

Using the above-described plasma reactor according to an embodiment of the present invention, a power unit may be controlled by determining whether plasma is in an off state, and thus damage of the power unit due to the off state of the plasma may be prevented.

While the present invention has been particularly shown and described with reference to embodiments thereof, it will be understood by one of ordinary skill in the art that various changes in form and details may be made therein without departing from the scope of the present invention as defined by the following claims.

The invention claimed is:

1. A plasma reactor comprising:
   a reactor body having a gas inlet at a side thereof, a gas outlet at another side thereof, and an annular loop space therein;
   a magnetic core provided in a shape surrounding a portion of the reactor body, and wound with a primary coil for receiving power from a power generator, so as to generate plasma by exciting a gas in the annular loop space;
   a controller for determining whether the plasma is in an off state, by comparing, to a reference value, an electrical parameter related to an output of the primary coil; and
   a sensor for measuring an electrical signal for obtaining the electrical parameter,
   wherein the electrical parameter comprises a phase difference between a current and a voltage through the primary coil,
   wherein the controller obtains the electrical parameter based on the electrical signal,
   wherein the reference value is set as a range including the electrical parameter of a case when the plasma is in an on state, and
   wherein the controller determines that the plasma in the reactor body is in the off state, when the phase difference is greater than the reference value.

2. The plasma reactor of claim 1, wherein the controller controls the power generator to cut off or reduce supply of the power from the power generator to the primary coil when it is determined that the plasma in the reactor body is in the off state.

3. The plasma reactor of claim 2, wherein the power generator comprises an inverter for switching the power, and
   wherein the controller turns off the inverter when it is determined that the plasma in the reactor body is in the off state.

4. The plasma reactor of claim 1, wherein the sensor comprises:
   a first sensor mounted on the primary coil to measure the current; and
   a second sensor for measuring the voltage through a secondary coil wound around the magnetic core,
   wherein the electrical signal comprises the current and the voltage.

5. The plasma reactor of claim 4, wherein the sensor further comprises a third sensor for measuring active power transferred through the primary coil,
   wherein the electrical signal further comprises the active power, and
   wherein the controller obtains apparent power based on a root mean square (RMS) value of the voltage and an RMS value of the current, and obtains the phase difference based on the active power and the apparent power.

6. The plasma reactor of claim 4, wherein the controller presets a reference voltage for arc detection, and detects whether an arc is generated in the reactor body, by comparing, to the reference voltage, the voltage measured by the second sensor.

7. The plasma reactor of claim 6, wherein the controller detects that the arc is generated in the reactor body, when the voltage is less than or equal to the reference voltage.

8. The plasma reactor of claim 4, wherein the controller presets a reference current for arc detection, and detects whether an arc is generated in the reactor body, by comparing, to the reference current, the current measured by the first sensor.

9. The plasma reactor of claim 8, wherein the controller detects that the arc is generated in the reactor body, when the current measured by the first sensor is greater than or equal to the reference current.

* * * * *